(12) United States Patent
Yi

(10) Patent No.: US 10,903,277 B2
(45) Date of Patent: Jan. 26, 2021

(54) SCALABLE, STACKABLE, AND BEOL-PROCESS COMPATIBLE INTEGRATED NEURON CIRCUIT

(71) Applicant: HRL Laboratories, LLC, Malibu, CA (US)

(72) Inventor: Wei L. Yi, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/706,393

(22) Filed: Dec. 6, 2019

(65) Prior Publication Data

US 2020/0111840 A1 Apr. 9, 2020

Related U.S. Application Data

(60) Division of application No. 15/879,363, filed on Jan. 24, 2018, now Pat. No. 10,541,274, which is a continuation-in-part of application No. 15/417,049, filed on Jan. 26, 2017, now Pat. No. 10,297,751.

(60) Provisional application No. 62/569,288, filed on Oct. 6, 2017, provisional application No. 62/517,776, filed on Jun. 9, 2017.

(51) Int. Cl.
| | |
|---|---|
| *H01L 27/26* | (2006.01) |
| *H01L 49/02* | (2006.01) |
| *H01L 45/00* | (2006.01) |
| *G11C 11/54* | (2006.01) |
| *H01L 27/24* | (2006.01) |
| *H01L 47/00* | (2006.01) |
| *H01L 47/02* | (2006.01) |
| *H01L 27/06* | (2006.01) |

(52) U.S. Cl.
CPC ........... *H01L 27/265* (2013.01); *G11C 11/54* (2013.01); *H01L 27/2463* (2013.01); *H01L 28/24* (2013.01); *H01L 28/40* (2013.01); *H01L 45/04* (2013.01); *H01L 45/1233* (2013.01); *H01L 45/146* (2013.01); *H01L 47/005* (2013.01); *H01L 47/02* (2013.01); *H01L 27/0629* (2013.01)

(58) Field of Classification Search
CPC ..... G11C 11/54; H01L 27/2463; H01L 28/24; H01L 45/04
USPC ........................................................ 365/148
See application file for complete search history.

(56) References Cited

U.S. PATENT DOCUMENTS

| | | | |
|---|---|---|---|
| 3,483,110 A | 12/1969 | Rozgonyi | |
| 6,426,891 B1 | 7/2002 | Katori | |
| 8,263,336 B2* | 9/2012 | Rothberg | ........... G01N 27/4145 435/6.1 |
| 8,324,976 B2 | 12/2012 | Borghetti | |
| 8,525,553 B1 | 9/2013 | Yi | |
| 8,669,785 B2 | 3/2014 | Pickett | |
| 8,729,518 B2 | 5/2014 | Pickett | |

(Continued)

FOREIGN PATENT DOCUMENTS

CA 2285160 A1 4/2000

OTHER PUBLICATIONS

U.S. Appl. No. 15/976,687, Yi, filed May 10, 2018.

(Continued)

*Primary Examiner* — Anthan Tran
(74) *Attorney, Agent, or Firm* — Ladas & Parry

(57) ABSTRACT

An integrated neuron circuit structure comprising at least one thin-film resistor, one Metal Insulator Metal capacitor and one Negative Differential Resistance device.

11 Claims, 11 Drawing Sheets

(56) References Cited

U.S. PATENT DOCUMENTS

| | | | |
|---|---|---|---|
| 8,767,449 B2 | 7/2014 | Pickett | |
| 8,854,860 B2 | 10/2014 | Ribeiro | |
| 8,936,763 B2 * | 1/2015 | Rothberg | G01N 27/4145 |
| | | | 422/407 |
| 9,627,490 B1 | 4/2017 | Eom | |
| 9,859,001 B2 | 1/2018 | Lee | |
| 10,297,751 B2 | 5/2019 | Yi | |
| 10,451,585 B2 * | 10/2019 | Rearick | G01N 27/27 |
| 2006/0011942 A1 | 1/2006 | Kim | |
| 2009/0184305 A1 | 7/2009 | Lee | |
| 2010/0051892 A1 | 3/2010 | Mikawa | |
| 2011/0134579 A1 | 6/2011 | Hsu | |
| 2012/0014161 A1 | 1/2012 | Pickett | |
| 2012/0075907 A1 | 3/2012 | Jo | |
| 2012/0085985 A1 | 4/2012 | Yang | |
| 2012/0099362 A1 | 4/2012 | Ribeiro | |
| 2012/0104346 A1 | 5/2012 | Yi | |
| 2012/0132882 A1 | 5/2012 | Seo | |
| 2012/0138885 A1 | 6/2012 | Wu | |
| 2012/0249252 A1 | 10/2012 | Borghetti | |
| 2012/0286743 A1 | 11/2012 | Soltani | |
| 2012/0321938 A1 | 12/2012 | Oukassi | |
| 2013/0021835 A1 | 1/2013 | Hwang | |
| 2013/0099187 A1 | 4/2013 | Pickett | |
| 2013/0106480 A1 | 5/2013 | Ribeiro | |
| 2013/0155572 A1 | 6/2013 | Popovici | |
| 2013/0176766 A1 | 7/2013 | Pickett | |
| 2013/0185237 A1 | 7/2013 | Heliot | |
| 2013/0242637 A1 | 9/2013 | Yang | |
| 2013/0250420 A1 | 9/2013 | Yang | |
| 2014/0003139 A1 | 1/2014 | Pickett | |
| 2014/0029327 A1 | 1/2014 | Strachan | |
| 2014/0029330 A1 | 1/2014 | Muraoka | |
| 2014/0214738 A1 | 7/2014 | Pickett | |
| 2014/0225646 A1 | 8/2014 | Pickett | |
| 2014/0252296 A1 | 9/2014 | Chueh | |
| 2014/0268995 A1 | 9/2014 | Joo | |
| 2014/0292428 A1 | 10/2014 | Koyama | |
| 2015/0053909 A1 | 2/2015 | Yang | |
| 2015/0137061 A1 | 5/2015 | Donghi | |
| 2015/0194203 A1 | 7/2015 | Pickett | |
| 2016/0233251 A1 | 8/2016 | Sasaki | |
| 2016/0260779 A1 | 9/2016 | Kawashima | |
| 2016/0285022 A1 | 9/2016 | Gotanda | |
| 2017/0040054 A1 | 2/2017 | Friedman | |
| 2017/0219444 A1 | 8/2017 | Kim | |
| 2018/0212145 A1 | 7/2018 | Yi | |
| 2018/0226453 A1 | 8/2018 | Yi | |

OTHER PUBLICATIONS

U.S. Appl. No. 15/879,363, Yi, filed Jan. 24, 2018.
U.S. Appl. No. 15/417,049, Yi, filed Jan. 26, 2017.
From U.S. Appl. No. 15/879,363 (now U.S. Pat. No. 10,541,274), Notice of Allowance dated Sep. 9, 2019.
From U.S. Appl. No. 15/879,363 (now U.S. Pat. No. 10,541,274), Office Action dated Mar. 19, 2019.
From U.S. Appl. No. 15/879,363 (now U.S. Pat. No. 10,541,274), Office Action dated Jan. 16, 2019.
From U.S. Appl. No. 15/417,049 (now U.S. Pat. No. 10,297,751), Notice of Allowance dated Jan. 2, 2019.
From U.S. Appl. No. 15/417,049 (now U.S. Pat. No. 10,297,751), Notice of Allowance dated May 1, 2018.
From U.S. Appl. No. 15/417,049 (now U.S. Pat. No. 10,297,751), Notice of Allowance dated Apr. 4, 2018.
From U.S. Appl. No. 15/417,049 (now U.S. Pat. No. 10,297,751), Office Action dated Dec. 4, 2017.
From U.S. Appl. No. 15/417,049 (now U.S. Pat. No. 10,297,751), Office Action dated Aug. 25, 2017.
PCT International Search Report and Written Opinion from PCT/US2018/015110 dated May 8, 2018.
PCT International Preliminary Report on Patentability (Chapter I) from PCT/US2018/015110 dated Jul. 30, 2019.
Apicella, P. "Leading tonically active neurons of the striatum from reward detection to context recognition", Trends in Neurosciences vol. 30, No. 6, pp. 299-306 (2007).
Beaumont, A. et al., Current-induced electrical self-oscillations across out-of-plane threshold switches based on VO2 layers integrated in crossbars geometry, Journal of Applied Physics, 115, 154502 (2014).
Cote, A.J., "Neuristor propagation in long-tunnel diodes," Proceedings of the IEEE 53, 164, 3 pages.
Crane, H. D., "Neuristor—A novel device and system concept," Proceedings of the IRE 50, 2048-2060 (1962).
Crane, H.D., "The neuristor," IRE Transactions Electronic Computers, 9, pp. 370-371(1960).
Crunteanu, A., "Voltage- and current-activated metal-insulator transition in $VO_2$-based electrical switches: a lifetime operation analysis," Science and Technology Advanced Materials. 11, 065002 (2010).
http://www.physiologyweb.com/lecture_notes/neuronal_action_potential/neuronal_action_potential_refractory_periods.html, Posted: Jul. 5, 2012.
Izhikevich, E.M. "Dynamical Systems in Neuroscience: The Geometry of Excitability and Bursting", The MIT Press, Cambridge MA (2007).
Izhikevich, E.M., et al., http://www.scholarpedia.org/article/FitzHugh-Nagumo_model (Accepted on Sep. 9, 2006).
Izhikevich, E. M., "Which model to use for cortical spiking neurons?" IEEE Transactions Neural Networks, vol. 15, No. 5. 1063-1070 (Sep. 2004).
Jo, et al., "Nanoscale Memristor Device as Synapse in Neuromorphic Systems," Nano Letters, 2010, 1297-1301.
Kawaradai, K., et al., "Neuristor-line operation with function of variable propagation velocity in plasma-coupled semiconductor devices," Proceedings Letters IEEE 61, (1973), 3 pages.
Kim, H.-T. et al., "Electrical oscillations induced by the metal-insulator transition in $VO_2$," Journal of Applied Physics 107, 023702 (2010).
Lee, Y. W. et al., "Metal-insulator transition-induced electrical oscillation in vanadium dioxide thin film," Applied Physics Letters, 92, 162903 (2008).
Nagumo, J. et al., "An active pulse transmission line simulating nerve axon," Proceedings of the IRE, 50, pp. 2061-2070 (1962).
Nishizawa, J.-I., "Two-line Neuristor with active element in series and in parallel," Int. J. Electronics, vol. 26, No. 5, pp. 437-369 (1969).
Pergament, A.L., et al., "Phase composition of anodic oxide films on transition metals: a thermodynamic approach," Thin Solid Films 322 (1998) pp. 33-36.
Pergament. A., et al. "Electrical Switching in Thin Film Structures Based on Transition Metal Oxides," Faculty of Physical Engineering, Petrozavodsk State University, Petrozavodsk 185910, Russia (2015), 26 pages.
Pickett, M. D., et al., "A scalable neuristor built with Mott memristors," Nature Materials, vol. 12, pp. 114-117 (2013).
Schultz, W., "Predictive reward signal of dopamine neurons," J. Neurophysiol. 80, 1-27 (1998).
Wang, Z., et al., "Memristors with diffusive dynamics as synaptic emulators for neuromorphic computing," Nature Materials, vol. 16, Jan. 2017.
Zhang, J-Gl, et al., "Filament Formation in Switching Devices Based on $V_2O_5$ Gel Films," J. Mater. Res., vol. 8, No. 3, pp. 558-564 (1993).
Extended EPO Search Report from European Patent Application No. 18745011.9 dated Sep. 22, 2020.

* cited by examiner

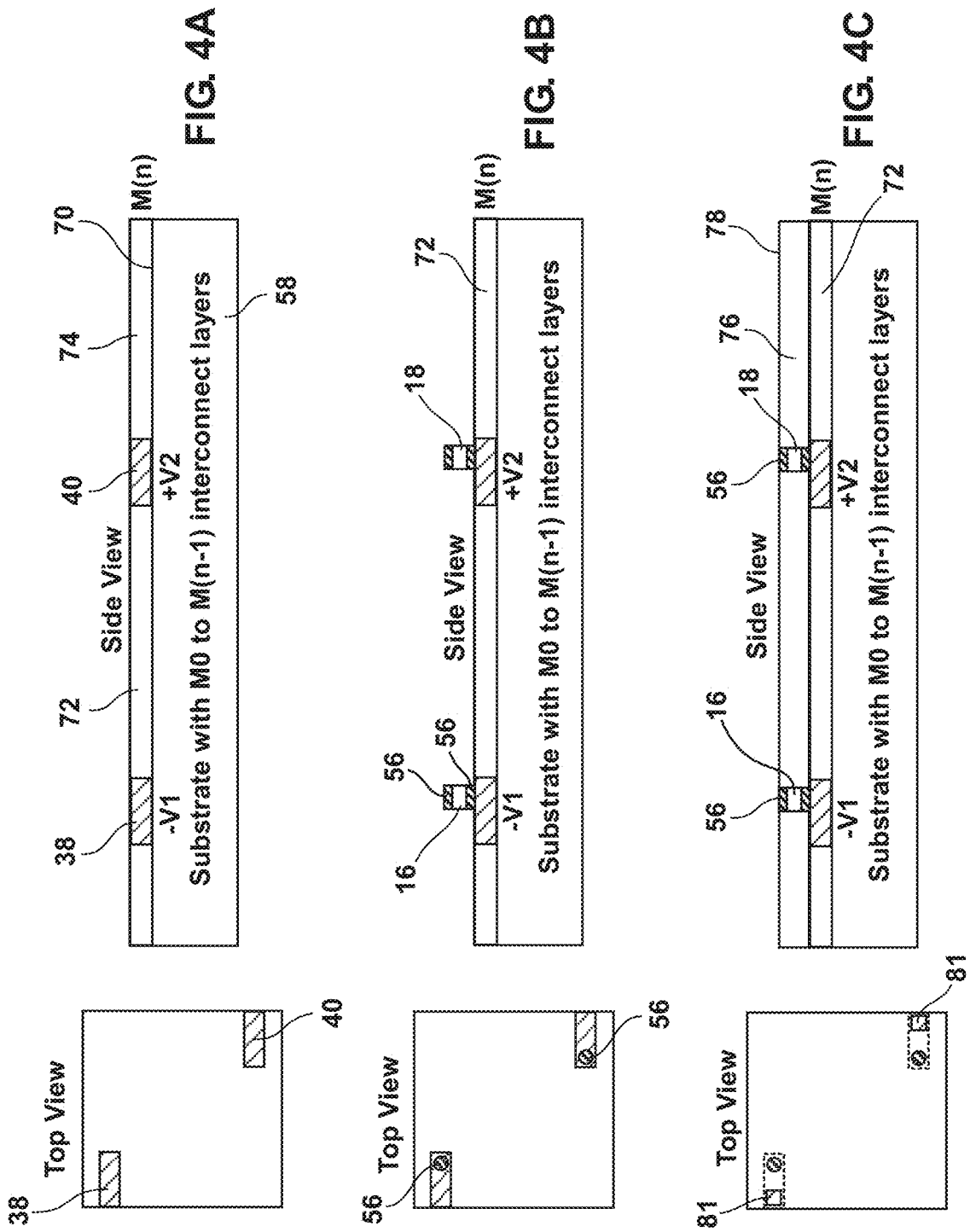

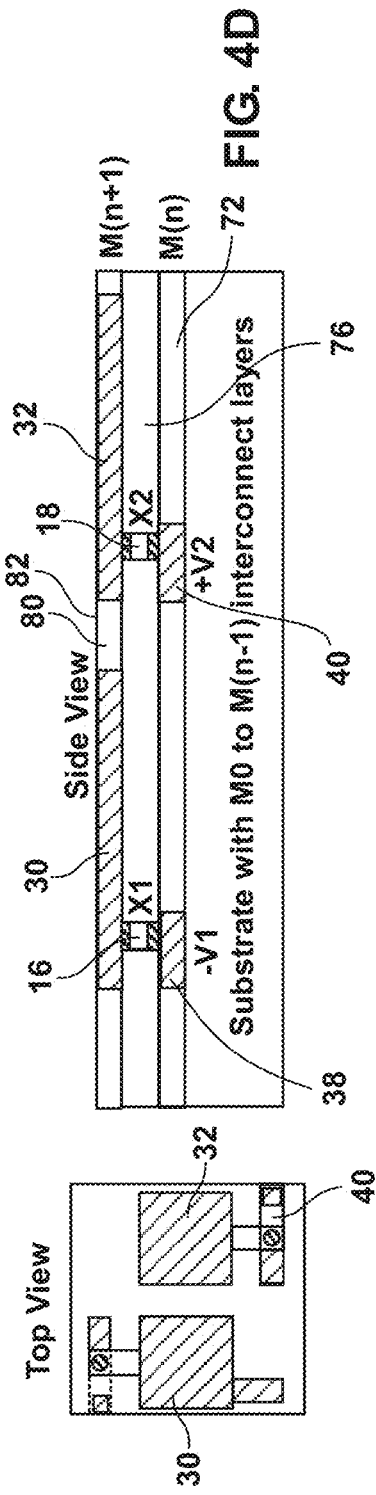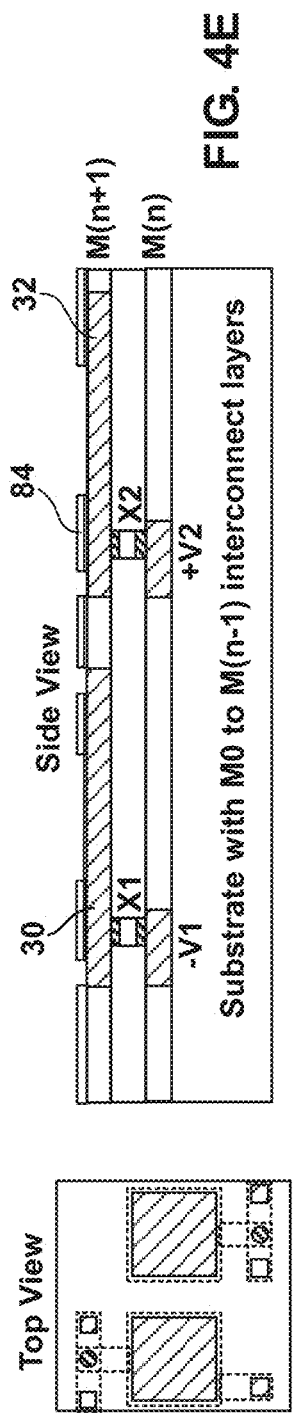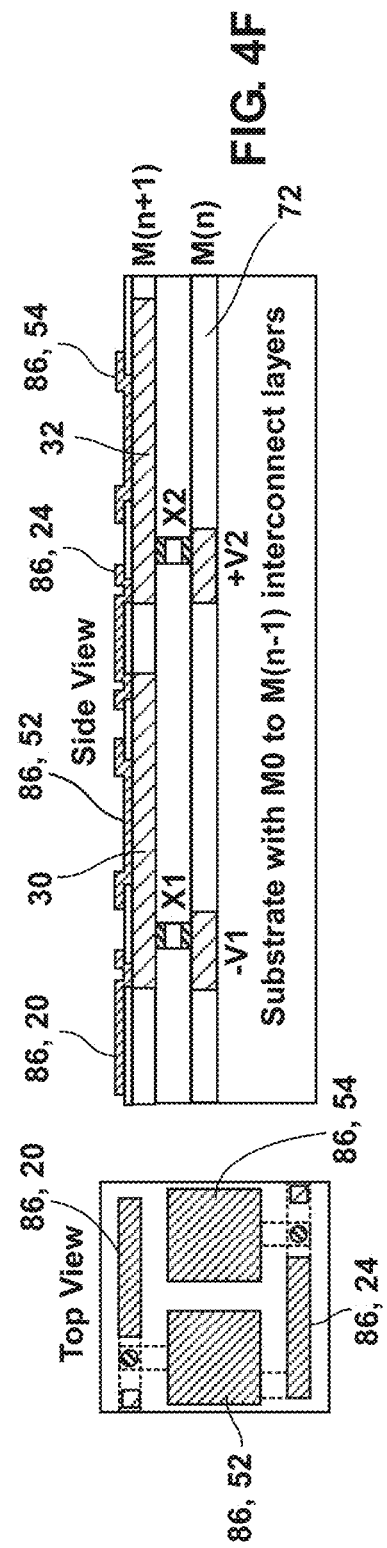

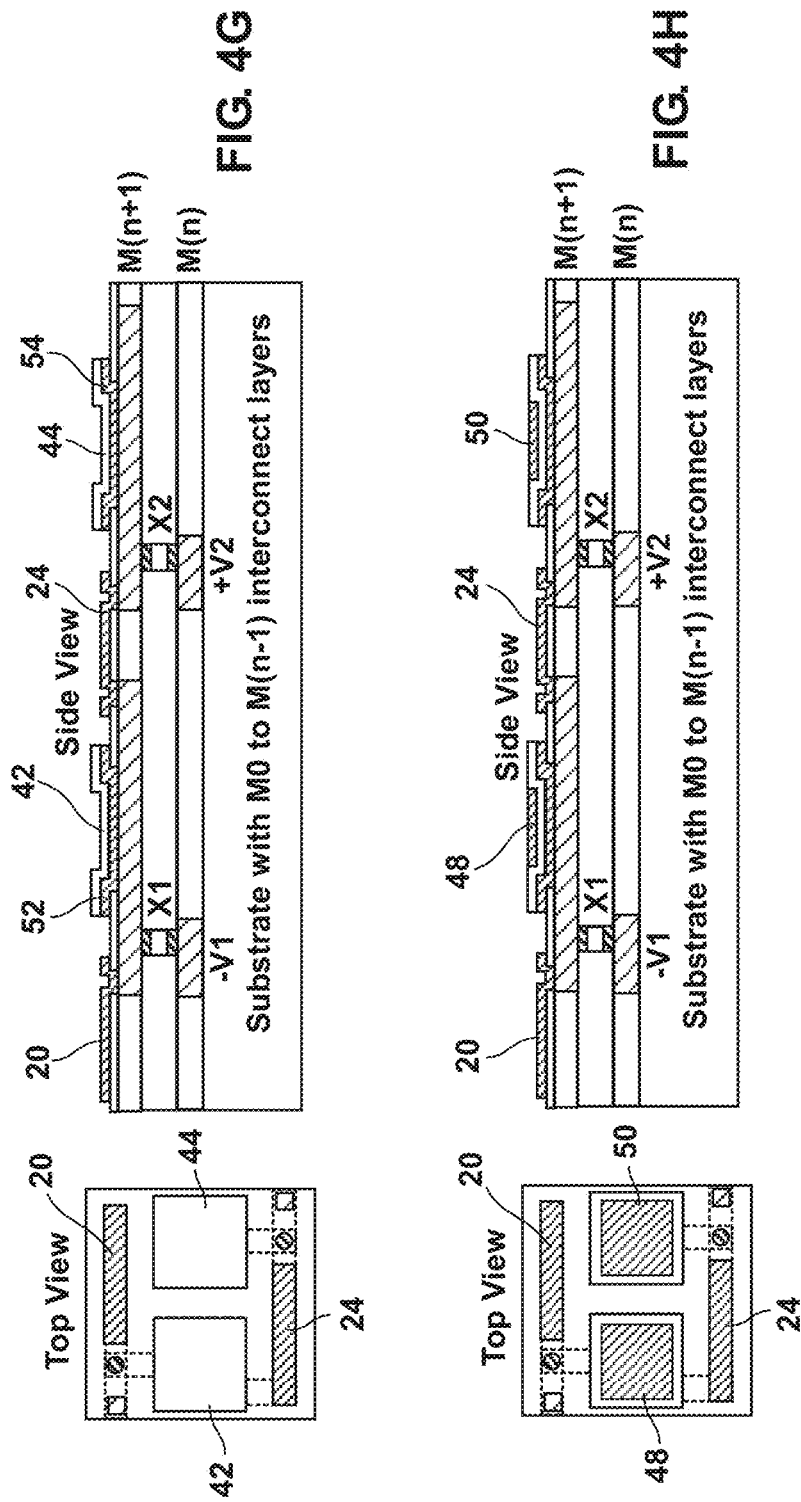

Visual cortex
(Wikipedia)

SCALABLE, STACKABLE, AND BEOL-PROCESS COMPATIBLE INTEGRATED NEURON CIRCUIT

RELATED APPLICATIONS

This presentation relates to and claims priority of U.S. patent application Ser. No. 15/417,049 (LOW-VOLTAGE THRESHOLD SWITCH DEVICES WITH CURRENT CONTROLLED S-TYPE NEGATIVE DIFFERENTIAL RESISTANCE BASED ON ELECTROFORMED VANADIUM OXIDE LAYER), filed Jan. 26, 2017 which is hereby incorporated by reference. This application relates to and claims priority of U.S. patent application No. 62/517,776 (SCALABLE EXCITATORY AND INHIBITORY NEURON CIRCUITRY BASED ON VANADIUM DIOXIDE RELAXATION OSCILLATORS), filed Jun. 9, 2017 which is hereby incorporated by reference. This application relates to and claims priority of U.S. patent application No. 62/569,288 (A SCALABLE, STACKABLE, AND BEOL-PROCESS COMPATIBLE INTEGRATED NEURON CIRCUIT), filed Oct. 6, 2017 which is hereby incorporated by reference. This application is a divisional of U.S. patent application Ser. No. 15/879,363 filed on Jan. 24, 2018 which is incorporated herein as though set forth in full.

TECHNICAL FIELD

This presentation describes an integrated neuron circuit, in particular an integrated neuron circuit that can be manufactured with a CMOS-compatible manufacturing process.

BACKGROUND

In 2012, a new type of highly scalable, low-power, and bio-plausible neuron circuit, termed "Neuristor" by its inventors, has emerged. Such neurons or neuron circuits are made of two closely coupled relaxation oscillators. Each oscillator emulate a certain type of voltage-controlled ion channel (e.g. Na+, K+, etc.) in a nerve cell. A specific type of relaxation oscillator, Pearson-Anson oscillator, composed of 3 elements: 1 active memristor, 1 reactive component (capacitor), and 1 resistor, was used as the key building block. It was shown that such a coupled relaxation oscillator circuitry can be used as an axon hillock circuitry to generate excitatory action potentials. (For reference, see DOI: 10.1038/NMAT3510, also see U.S. Pat. Nos. 8,324,976 B2; 8,669,785 B2).

However, there is yet no demonstration of an integrated "Neuristor" circuit. The aforementioned reference of DOI: 10.1038/NMAT3510 was demonstrated using discrete devices and breadboard level connections. Although the same author filed a U.S. Pat. No. 8,729,518 B2: Multilayer structure based on a negative differential resistance material, it only provided some overview and functional bock diagrams of hypothetical integrated "Neuristor" circuitries, but did not include any detailed IC structure, layout, or process flow for foundry-compatible fabrication.

SUMMARY

This presentation relates to an integrated circuit (IC) of an artificial spiking neuron, which is for example compatible with a Cu or Al Back End-Of-the-Line (BEOL) interconnect process (e.g. damascene or dual-damascene) in a modern IC foundry. A practical IC layout and foundry-compatible process flow is described in this presentation.

This presentation relates to an integrated circuit structure consisting passive thin-film resistors, Metal-Insulator-Metal (MIM) capacitors and active vanadium dioxide (VO2) Negative Differential Resistance (NDR) devices that can function as an artificial spiking neuron. According to an embodiment of this presentation, the layout of the integrated neuron that can fit into an area of 10 μm² or smaller. The VO2 material can be replaced with other types of materials possessing similar thermally-driven insulator-to-metal transitions. The material can be a binary, ternary, or more sophisticated oxide compounds, or other materials such as chalcogenides. Embodiments of this presentation relate to methods of fabricating integrated neuron circuits such as illustrated in the figures above and detailed in the Description hereafter.

FIG. 1 illustrates an electrical schematic of a compact, scalable, and biomimetic integrated neuron circuit 10 according to this presentation, the neuron circuit comprising two coupled relaxation oscillators (12, 14), each comprising one active metal-oxide-metal NDR device (16, 18), and several passive integrated components: for example resistors (20, 24) and capacitors (22, 26); for example as disclosed or claimed in US provisional application No. 62/517,776, which is incorporated by reference. As detailed hereafter, an integrated neuron circuit 10 according to embodiments of this presentation only requires up to 3 layers of interconnect metals, and can be scaled down to a lateral area of 10 μm² or even smaller. Moreover, all the materials used to manufacture an integrated neuron circuit according to embodiments of this presentation can be deposited and hence as also detailed hereafter the integrated neurons can be stacked into multiple layers to achieve even higher effective area density. According to embodiments of this presentation, the neuron circuits can be integrated with ultra-dense memristor synapse crossbar array to form a highly scalable spiking neural network circuitry. Of course, other neurons than the neuron circuit illustrated in FIG. 1 can also be made using the method disclosed in this presentation, for example such as illustrated in FIG. 1C of U.S. 62/517,776.

The presented integrated neuron circuits provide a self-sufficient pathway to construct a transistorless neuromorphic network that has energy efficiency and size at biological scales. Such a memristive neuromorphic network enables execution of any class of data analysis algorithms that can be mapped into the spike domain, and allows computationally intensive algorithms to be executed in size, weight and power-(SWaP) constrained platforms; for example deep learning, Bayesian reasoning or inference. Examples of SWaP-constrained platforms include autonomous robotic vehicles such as unmanned aerial vehicles (UAVs), Autonomous underwater vehicles (AUVs), autonomous self-driving cars, etc.

Embodiments of this presentation generally relate to an integrated neuron circuit structure comprising at least one thin-film resistor, one MIM capacitor and one NDR device.

Embodiments of this presentation relate to an integrated neuron circuit structure comprising at least one thin-film resistor, one Metal Insulator Metal capacitor and one Negative Differential Resistance device.

According to an embodiment of this presentation, the integrated neuron circuit comprises first and second thin-film resistors, first and second Metal Insulator Metal capacitors and first and second Negative Differential Resistance devices.

According to an embodiment of this presentation, the integrated neuron circuit comprises an input node connected, through the first thin-film resistor, to a first intermediate node common to the first Metal Insulator Metal capacitor and the first Negative Differential Resistance device; said intermediate node being connected, through the second thin-film resistor, to a second intermediate node of the integrated circuit; said second intermediate node being common to the second Metal Insulator Metal capacitor and the second Negative Differential Resistance device; and an output node connected to the second intermediate node.

According to an embodiment of this presentation, the first Metal Insulator Metal capacitor is connected between said first intermediate node and a ground node; and the second Metal Insulator Metal capacitor is connected between said second intermediate node and said ground node.

According to an embodiment of this presentation, the first Negative Differential Resistance device is connected between said first intermediate node and a first voltage supply node; and the second Negative Differential Resistance device is connected between said second intermediate node and a second voltage supply node.

According to an embodiment of this presentation, at least one of the first and second Negative Differential Resistance devices comprises a region of Negative Differential Resistance material located above, and in electrical contact with, a conductor made of a first metal layer of the integrated neuron circuit; said region of Negative Differential Resistance material being located below, and in electrical contact with, a conductor made of a second metal layer of the integrated neuron circuit.

According to an embodiment of this presentation, at least one of the first and second thin-film resistors comprises a thin-film layer having a first portion located above and in electrical contact with said conductor made of a second metal layer of the integrated neuron circuit; said thin-film layer having a second portion located below and in electrical contact with a first conductor made of a third metal layer of the integrated neuron circuit.

According to an embodiment of this presentation, at least one of the first and second Metal Insulator Metal capacitors comprises a dielectric layer above and in electrical contact with said conductor made of said second metal layer of the integrated neuron circuit; at least a portion of said dielectric layer being below and in electrical contact with a top electrode layer, itself below and in electrical contact with a second conductor made of said third metal layer of the integrated neuron circuit.

According to an embodiment of this presentation, the top electrode layer is made out of the same material as the thin-film resistors.

According to an embodiment of this presentation, a bottom electrode layer is arranged between the dielectric layer of the at least one of the first and second Metal Insulator Metal capacitors and said conductor made of said second metal layer of the integrated neuron circuit.

According to an embodiment of this presentation the top and bottom electrode layers are made out of the same material as the thin-film resistors.

According to an embodiment of this presentation, at least one of the first and second thin-film resistors comprises a thin-film layer having a first portion located below and in electrical contact with a first conductor made of a third metal layer of the integrated neuron circuit; said thin-film layer having a second portion located below and in electrical contact with a second conductor made of the third metal layer of the integrated neuron circuit.

According to an embodiment of this presentation, at least one of the first and second Metal Insulator Metal capacitors comprises a first electrode in electrical contact with said conductor made of said second metal layer of the integrated neuron circuit; said first electrode having top and bottom surfaces in contact with top and bottom dielectric layers; said bottom dielectric layer being above and in electrical contact with a bottom second electrode, itself in electrical contact with a second conductor made of said third metal layer of the integrated neuron circuit; and said top dielectric layer being below and in electrical contact with a top second electrode, itself in electrical contact with said second conductor made of said third metal layer of the integrated neuron circuit.

According to an embodiment of this presentation, said region of Negative Differential Resistance material is connected to said conductor made of a first metal layer of the integrated neuron circuit and said conductor made of a second metal layer of the integrated neuron circuit through contact metal layers.

According to an embodiment of this presentation, said metal layers are copper, tungsten or aluminum layers.

According to an embodiment of this presentation, said thin-film layers are TaN or SiCr layers.

According to an embodiment of this presentation said dielectric layer is a HfO2 or ZrO2 layer.

According to an embodiment of this presentation, said region of Negative Differential Resistance material is a region of VO2.

According to an embodiment of this presentation, said contact metal layers are TiN or TaN layers.

An embodiment of this presentation relates to an integrated neuron circuit structure as outlined above, formed on a same wafer as a CMOS integrated circuit, in an area using the three top metal layers of the CMOS integrated circuit as said first, second and third metal layers.

An embodiment of this presentation relates to a method of manufacturing an integrated neuron circuit structure, using at least one thin-film resistor, one Metal Insulator Metal capacitor and one Negative Differential Resistance device.

According to an embodiment of this presentation the method comprises forming said integrated neuron circuit structure's first and second thin-film resistors, first and second Metal Insulator Metal capacitors and first and second Negative Differential Resistance devices.

According to an embodiment of this presentation the method comprises connecting an input node, through the first thin-film resistor, to a first intermediate node common to the first Metal Insulator Metal capacitor and the first Negative Differential Resistance device, connecting said first intermediate node, through the second thin-film resistor, to a second intermediate node of the integrated circuit; said second intermediate node being common to the second Metal Insulator Metal capacitor and the second Negative Differential Resistance device; and connecting an output node to the second intermediate node.

According to an embodiment of this presentation the method comprises connecting the first Metal Insulator Metal capacitor between said first intermediate node and a ground node; and connecting the second Metal Insulator Metal capacitor between said second intermediate node and said ground node.

According to an embodiment of this presentation the method comprises connecting the first Negative Differential Resistance device between said first intermediate node and a first voltage supply node; and connecting the second Negative Differential Resistance device between said second intermediate node and a second voltage supply node.

According to an embodiment of this presentation the method comprises forming at least one of the first and second Negative Differential Resistance devices with a region of Negative Differential Resistance material located above, and in electrical contact with, a conductor made of a first metal layer of the integrated neuron circuit; said region of Negative Differential Resistance material being located below, and in electrical contact with, a conductor made of a second metal layer of the integrated neuron circuit.

According to an embodiment of this presentation the method comprises forming at least one of the first and second thin-film resistors with a thin-film layer having a first portion located above and in electrical contact with said conductor made of a second metal layer of the integrated neuron circuit; said thin-film layer having a second portion located below and in electrical contact with a first conductor made of a third metal layer of the integrated neuron circuit.

According to an embodiment of this presentation the method comprises forming at least one of the first and second Metal Insulator Metal capacitors with a dielectric layer above and in electrical contact with said conductor made of said second metal layer of the integrated circuit; at least a portion of said dielectric layer being below and in electrical contact with a top electrode layer, itself below and in electrical contact with a second conductor made of said third metal layer of the integrated neuron circuit.

According to an embodiment of this presentation the method comprises making said top electrode layer out of the same material as the thin-film resistors.

According to an embodiment of this presentation the method comprises arranging a bottom electrode layer between the dielectric layer of the at least one of the first and second Metal Insulator Metal capacitors and said conductor made of said second metal layer of the integrated neuron circuit.

According to an embodiment of this presentation, in the method outlined above at least one of the first and second thin-film resistors comprises a thin-film layer has a first portion located below and in electrical contact with a first conductor made of a third metal layer of the integrated neuron circuit; said thin-film layer having a second portion located below and in electrical contact with a second conductor made of the third metal layer of the integrated neuron circuit.

According to an embodiment of this presentation, in the method outlined above at least one of the first and second thin-film resistors comprises a thin-film layer having a first portion located below and in electrical contact with a first conductor made of a third metal layer of the integrated neuron circuit; said thin-film layer having a second portion located below and in electrical contact with a second conductor made of the third metal layer of the integrated neuron circuit.

According to an embodiment of this presentation the method comprises forming said at least one of the first and second Metal Insulator Metal capacitors with a first electrode in electrical contact with said conductor made of said second metal layer of the integrated neuron circuit; said electrode having top and bottom surfaces in contact with top and bottom dielectric layers; said bottom dielectric layer being above and in electrical contact with a bottom second electrode, itself in electrical contact with a second conductor made of said third metal layer of the integrated neuron circuit; and said top dielectric layer being below and in electrical contact with a top second electrode, itself in electrical contact with said second conductor made of said third metal layer of the integrated neuron circuit.

According to an embodiment of this presentation, the method comprises making said electrode layers out of the same material as the thin-film resistors.

According to an embodiment of this presentation, the method comprises connecting said region of Negative Differential Resistance material to said conductor made of a first metal layer of the integrated neuron circuit and said conductor made of a second metal layer of the integrated neuron circuit through contact metal layers.

According to an embodiment of this presentation, in the method outlined above said metal layers are copper, tungsten or aluminum layers.

According to an embodiment of this presentation, in the method outlined above said thin-film layers are TaN or SiCr or Ta2N or SiCr:C or NiCr or NiCrAl layers.

According to an embodiment of this presentation, in the method outlined above said dielectric layer comprises a layer of HfO2 or ZrO2 or Al2O3 or Ta2O5 or perovskite-type dielectrics, including SrTiO3, or Al doped TiO2.

According to an embodiment of this presentation, in the method outlined above said region of Negative Differential Resistance material is a region of VO2.

According to an embodiment of this presentation, in the method outlined above said contact metal layers are TiN or TaN layers.

An embodiment of this presentation also relates to a method of manufacturing an integrated circuit, the method comprising forming an integrated neuron circuit structure according to the method outlined above, on a same wafer as a CMOS integrated circuit, in an area using the three top metal layers of the CMOS integrated circuit as said first, second and third metal layers.

An embodiment of this presentation also relates to a method of manufacturing an integrated neuron circuit structure, the method comprising: forming first and second voltage supply leads out of a first metal layer on a top surface of an integrated circuit wafer; forming a first dielectric layer on portions of the top surface of the wafer not covered by said first metal layer; forming first and second negative differential resistance material regions on portions of said first and second voltage supply leads; forming a second dielectric layer on portions of the top surface of the wafer not covered by said first and second negative differential resistance material regions; forming first and second intermediate node lines out of a second metal layer on said first and second negative differential resistance material regions and on said second dielectric layer; forming a third dielectric layer on portions of the top surface of the wafer not covered by said first and second intermediate node lines; forming a dielectric thin film on the top surface of the wafer; patterning said dielectric thin film and forming a first lower capacitor plate and a first resistor line out of a first metal thin-film on portions of the first intermediate node line and on portions of the thin film dielectric layer, and forming a second lower capacitor plate and a second resistor line out of said first metal thin-film on portions of the second intermediate node line and on portions of the thin-film dielectric layer, the second resistor line contacting the first and second intermediate node lines; covering the first and second lower capacitor plates with a capacitor dielectric layer; covering portions of the capacitor dielectric layer with first and second upper capacitor plates formed out of a second metal thin-film layer; covering portions of the capacitor dielectric layer with first and second upper capacitor plates formed out of a second metal thin-film layer; forming a fourth dielectric layer on the top surface of the wafer; and forming through the fourth dielectric layer via connections to the first and second upper capacitor plates; to a portion of the second resistor line above the second connection line and to a portion of the first resistor line not above the first connection line; the via connections being made out a third metal layer.

According to an embodiment of this presentation, the method further comprises forming via connections to the first and second voltage supply leads.

According to an embodiment of this presentation, forming via connections comprises using a dual damascene process to form further connections of the vias.

According to an embodiment of this presentation, said integrated circuit wafer comprises CMOS circuits and said first, second and third metal layers are three consecutive metal layers of the CMOS fabrication process.

According to an embodiment of this presentation, the method further comprises forming contact metal layer films between the negative differential resistance material regions and the first and second metal layers.

According to an embodiment of this presentation, in the method outlined above, the first, third and fourth dielectric layers comprise a high-k dielectric material, and the second dielectric layer and dielectric thin film comprise a low-k dielectric material.

According to an embodiment of this presentation, in the method outlined above, said metal layers are copper, tungsten or aluminum layers.

According to an embodiment of this presentation, in the method outlined above, said thin-film layers are TaN or SiCr layers.

According to an embodiment of this presentation, in the method outlined above, said dielectric layer is a HfO2 or ZrO2 layer.

According to an embodiment of this presentation, in the method outlined above, said region of Negative Differential Resistance material is a region of VO2.

According to an embodiment of this presentation, in the method outlined above, said contact metal layers are TiN or TaN layers.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 4A to 4K schematically show each a top view and a side cross-section view of successive steps of the manufacturing of an integrated neuron circuit according to an embodiment of this presentation.

DETAILED DESCRIPTION

Figure 1:
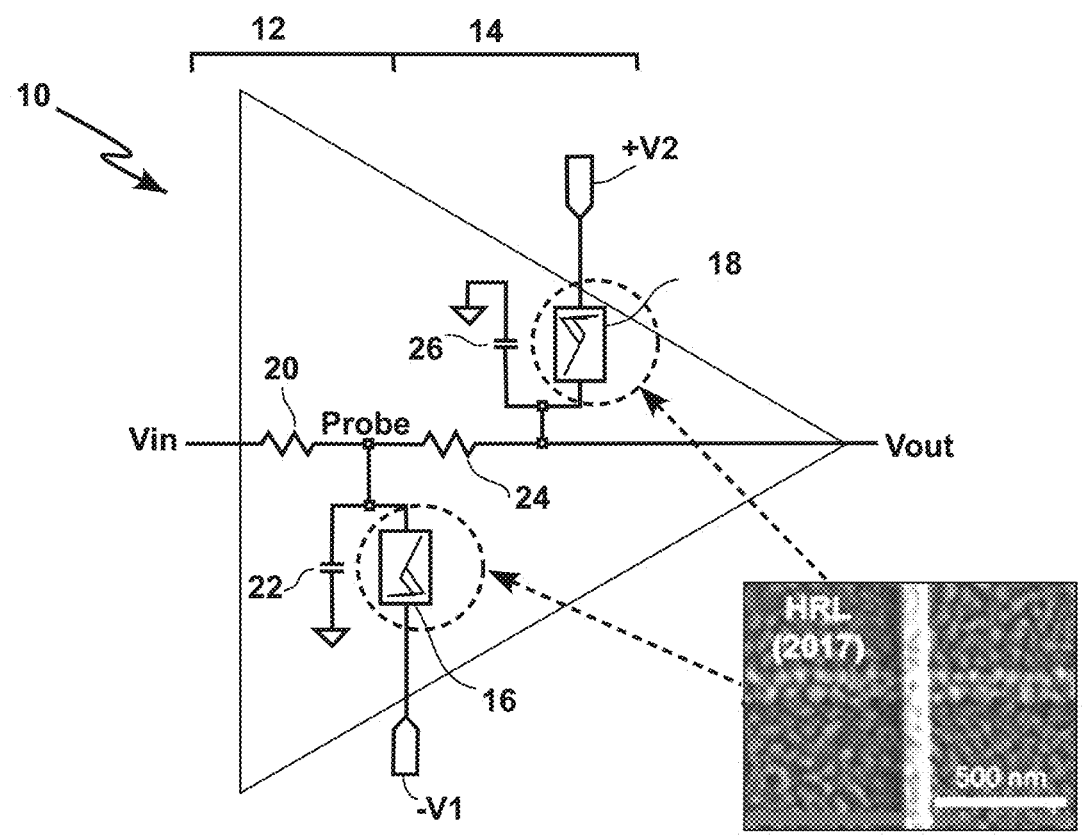
FIG. 1 shows an electrical schematic of an integrated neuron circuit according to an embodiment of this presentation.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the claimed invention.

This presentation achieves the integration of a neuron circuit by using integrated NDR device switches; for example made out of VO2. An example of NDR switch is for example a Metal-Oxide-Metal bidirectional VO2 switch as disclosed or claimed in U.S. application Ser. No. 15/417,049 titled "LOW-VOLTAGE THRESHOLD SWITCH DEVICES WITH CURRENT-CONTROLLED NEGATIVE DIFFERENTIAL RESISTANCE BASED ON ELECTRO-FORMED VANADIUM OXIDE LAYER", hereby incorporated by reference. Manufacturing a NDR device may require a high Temperature Budget (Tmax), which is defined as the highest process temperature required for deposition of the thin-film material and for post deposition anneal if needed. Embodiments of this presentation provide that in the multilayer IC structure, material layers that require higher Tmax are fabricated before fabricating material layers with lower Tmax. In this way, this presentation avoids compromising or damaging the lower-Tmax materials, since higher-Tmax materials are already fabricated and passivated before the lower-Tmax materials are processed.

The table hereafter shows the estimated Tmax values (or "Temperature Budget", in degree Celsius) of several candidate materials. Based on these values, VO2 active NDR devices are fabricated first, followed by the integrated MIM capacitors (HfO2) and thin-film resistors (SiCr or TaN). The list of candidate materials and enumerated temperature budgets here are for reference purpose only, and are not meant to be exclusive. The temperature budgets can be engineered. If vertical stacking of multiple layers of integrated neurons is needed, then Tmax for the VO2 active NDR layer can be reduced to accommodate the passive components. If Tmax of VO2 is engineered to be at 450° C. or less, then the thermal budget of the integrated neuron is compatible with the conventional CMOS BEOL process.

| Material | Deposition Method | Function | Temperature Budget (° C.) |
| --- | --- | --- | --- |
| VO$_2$ | Sputtering | Active, NDR | 500-575 |
| SiCr | Sputtering | Passive, thin-film resistor | 300-400 |
| TaN | Sputtering | Passive, thin-film resistor | 400-575 |
| HfO$_2$ | ALD | Passive, MIM capacitor | 370 |

This presentation also achieves the integration of a neuron circuit by using integrated MIM capacitors, for example using a high-dielectric-constant (high-κ) dielectric such as HfO2 or ZrO2 (κ≅25). It is known that comb capacitors (also referred to as metal oxide metal (MOM) capacitors or interdigitated capacitors) have the highest possible volumetric capacitance density. However, the Inventor has noted that high capacitance density of comb capacitors can only be achieved when a large number of metal layers are used, which increase the complexity and cost of process. The large number of metal layers also limits metal routings, and makes it challenging to reduce the chip area. Although not a preferred device structure for the aforementioned reasons, the inventor does not exclude the use of comb capacitors for fabricating the presented integrated neuron circuits, especially for cases wherein high neuron density is not a critical factor for the application.

On the other hand, the Inventor has noted that MIM capacitors, which is a vertical device created by two metal plates or electrodes with a thin high-κ dielectric insulator layer in between, can advantageously be used to manufacture an integrated neuron circuit with sufficiently high capacitance density and is much simpler to fabricate; in particular using thin-film resistor layers in replacement of at least one metal plate of the capacitor. In today's 14 to 22 nm CMOS technology nodes, the capacitance density of commonly used two-plate MIM BEOL decoupling capacitors reaches 15 to 20 fF/µm$^2$, while the three-plate version can reach a capacitance density higher than 40 fF/µm$^2$.

FIGS. 2A and 2B respectively illustrate a top view and a side cross section view ("unfolded" to show most of the elements of the circuit) of an integrated neuron circuit 10 according to an embodiment of this presentation, comprising at least one thin-film resistor (20, 24), at least one MIM capacitor (22, 26) and at least one Negative Differential Resistance device (16, 18). According to an embodiment of this presentation, integrated neuron circuit 10 comprises first (20) and second (24) thin-film resistors, first (22) and second (26) MIM capacitors and first (16) and second (18) Negative Differential Resistance devices. According to an embodiment of this presentation, integrated neuron circuit 10 comprises: an input node 28 connected, through the first thin-film resistor 20, to a first intermediate node 30 common to the first Metal Insulator Metal capacitor 22 and the first NDR device 16; said first intermediate node 30 being connected, through the second thin-film resistor 24, to output second intermediate node 32 of the integrated circuit 10; said second intermediate node 32 being common to the second MIM capacitor 26 and the second Negative Differential Resistance device 18. As detailed hereafter, the second intermediate node 32 is connected to an output node 46.

According to an embodiment of this presentation, the first MIM capacitor 22 is connected between said first intermediate node 30 and a ground node 36; and the second MIM capacitor 26 is connected between said second intermediate node 32 and said ground node 36. According to an embodiment of this presentation, the first Negative Differential Resistance device 16 is connected between said first intermediate node 30 and a first voltage supply node 38; and the second Negative Differential Resistance device 18 is connected between said second intermediate node 32 and a second voltage supply node 40. The first voltage supply node 38 can be connected (not shown), for example through a via, to a first voltage source (e.g. −V1). The second voltage supply node 40 can be connected (not shown), for example through a via, to a second voltage source (e.g. +V2).

According to an embodiment of this presentation, neuron circuit 10 comprises a first probe node 27 arranged to contact through a via the first intermediate node 30 or to contact (as illustrated) a portion of the first thin-film resistor 20 that is above an in contact with the first intermediate node 30. Similarly, neuron circuit 10 can comprise a second probe node 45 arranged to contact through a via the first intermediate node 3 or to contact (as illustrated) a portion of the second thin-film resistor 24 that is above an in contact with the first intermediate node 30. The first and second probe nodes 27, 45 can for example be used (together with input node 28 and output node 46, respectively) to check the value of first and second resistors 20, 24 for the sake of statistical process control (SPC) during the IC manufacturing process.

According to an embodiment of this presentation, at least one of the first (16) and second (18) Negative Differential Resistance devices comprises a region of Negative Differential Resistance material (16') located above, and in electrical contact with, a conductor (respectively forming voltage supply node 38 and voltage supply node 40) made of a first metal layer of the integrated circuit 10; said region of Negative Differential Resistance material (16') being located below, and in electrical contact with, a conductor (respectively forming intermediate node 30 and second intermediate node 32) made of a second metal layer of the integrated circuit 10. According to an embodiment of this presentation, at least one of the first (20) and second (24) thin-film resistors comprises a thin-film layer having a first portion located above and in electrical contact with said conductor (respectively forming intermediate node 30 and second intermediate node 32) made of a second metal layer of the integrated circuit 10; said thin-film layer (respectively 20, 24) having a second portion located below and in electrical contact with a first conductor (respectively forming input node 28 and an output via 46) made of a third metal layer of the integrated circuit 10.

According to an embodiment of this presentation, at least one of the first (22) and second (26) MIM capacitors comprises a dielectric layer (42, 44) arranged above, and in electrical contact with, said conductor (respectively 30, 32) made of said second metal layer of the integrated circuit 10; at least a portion of said dielectric layer (42, 44) being below, and in electrical contact with, a top electrode layer (48, 50), itself below and in electrical contact with a second conductor (36) made of said third metal layer of the integrated circuit 10. According to an embodiment of the present disclosure, said top electrode layer (48, 50) is made out of the same material as the thin-film resistors (20, 24). According to an embodiment of this presentation, a bottom electrode layer (respectively 52, 54) is arranged between the dielectric layer (42, 44) of the at least one of the first (22) and second (26) MIM capacitors and said conductor (30, 32) made of said second metal layer of the integrated circuit 10.

According to embodiments of this presentation, said region of Negative Differential Resistance material (16') is connected to said conductor made of a first metal layer (respectively 38, 40) of the integrated circuit 10 and said conductor (respectively 30, 32) made of a second metal layer of the integrated circuit 10 through contact metal layers 56.

According to embodiments of this presentation, the first, second and third metal layers of the integrated circuit 10 are copper, tungsten or aluminum layers. According to embodiments of this presentation, the thin-film layers 56 are TaN or SiCr layers. According to an embodiment of this presentation, the thin film layer 56 can also comprise Ta2N; SiCr:C (carbon doped SiCr); NiCr, NiCrAl. According to embodiments of this presentation, the MIM capacitors (22, 26)

dielectric layer is a HfO2 or ZrO2 layer. According to an embodiment of this presentation, the MIM capacitors (22, 26) dielectric layer can comprise a layer of other types of commonly used medium-K or high-K dielectric materials, such as Al2O3, Ta2O5, and perovskite-type dielectrics (SrTiO3, or Al doped TiO2).

According to embodiments of this presentation, the regions of Negative Differential Resistance material (16') comprise a layer of VO2. According to embodiments of this presentation, the NDR material can also be binary oxides with Magneli phases, $M_nO_{2n-1}$ (M being V, Nb, Ti cations, n being an integer); or ternary perovskite-type oxides, $RMO_3$ (R being rare earth cations such as Pr, Nd, Sm; M being 3d transition metals such as Ni and Co); or $NbO_2$ or $Ti_2O_3$ or $Ti_3O_5$. The NDR phenomena in these enumerated materials all arise from a thermodynamically driven Mott insulator-to-metal phase transition, but the characteristic transition temperature, $T_C$, varies from material to material. A moderate $T_C$ at above room temperature, such as the case of VO2 with its $T_C$ at near 67° C., is ideal for most electronic applications.

According to embodiments of this presentation the contact metal layers (56) are TiN or TaN layers. According to embodiments of this presentation, where Cu interconnects are used (for example for nodes 30, 32), a thin layer of liner/barrier metal (BRM) fabricated by physical vapor deposition (PVD) or atomic layer deposition (ALD) methods can be used as: Cu diffusion barrier and/or Adhesion layer and/or Redundant conductor. Common BRM materials include: transition metal nitrides: TiN, TaN, WN; transition metal alloys: TiW (amorphous); and amorphous ternary alloys: TaSN, TiSiN.

According to embodiments of this presentation, the electrode layers (48, 50, 52, 54) are made out of the same material as the thin-film resistors 20, 24.

According to embodiments of this presentation, integrated neuron circuit 10 can be formed on a same wafer 58 as a CMOS integrated circuit (illustrated in FIG. 7), in an area of the wafer where the three top metal layers of the CMOS integrated circuit are used as said first, second and third metal layers of the integrated neuron circuit 10.

Figure 2:
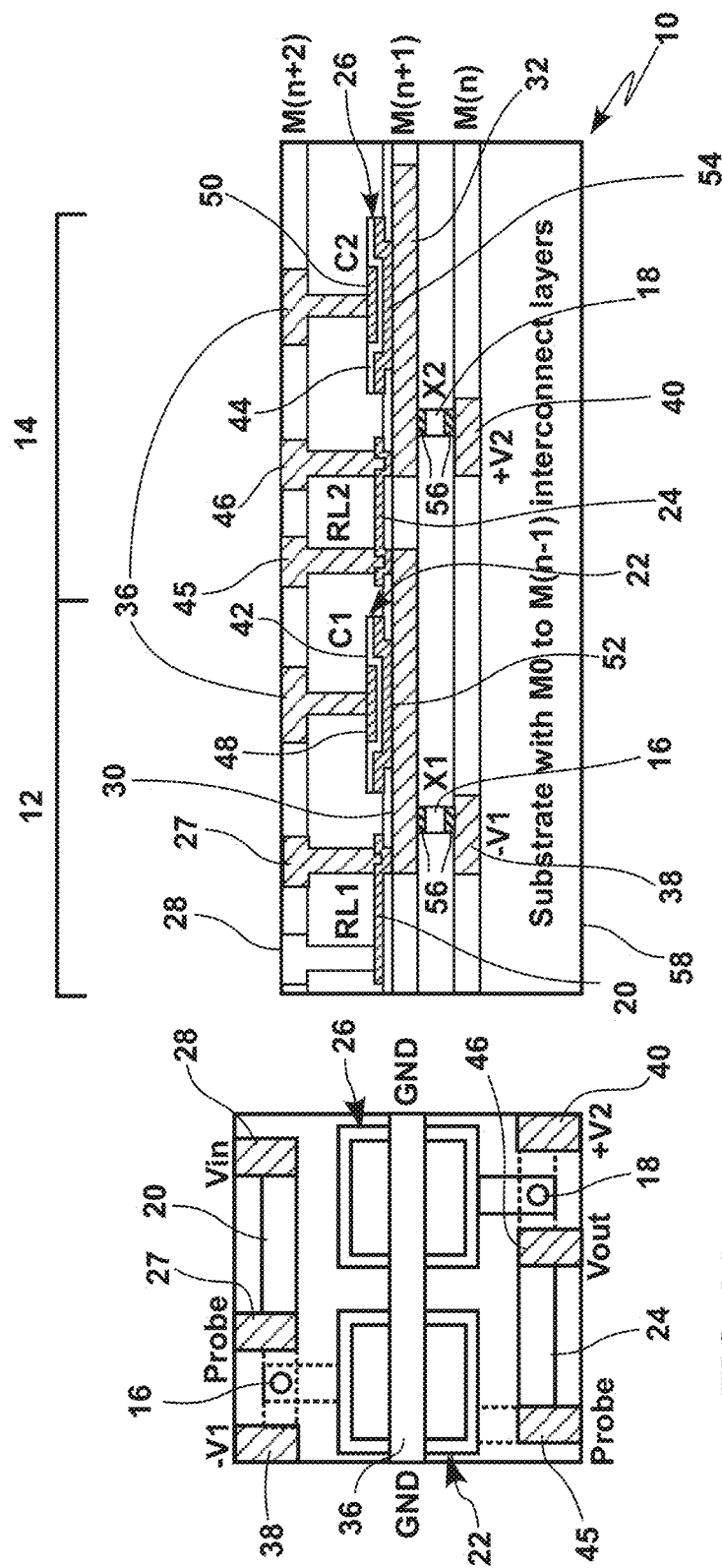
FIGS. 2A and 2B respectively show a top view and a side cross-section view of an integrated neuron circuit according to an embodiment of this presentation.
Figure 3:
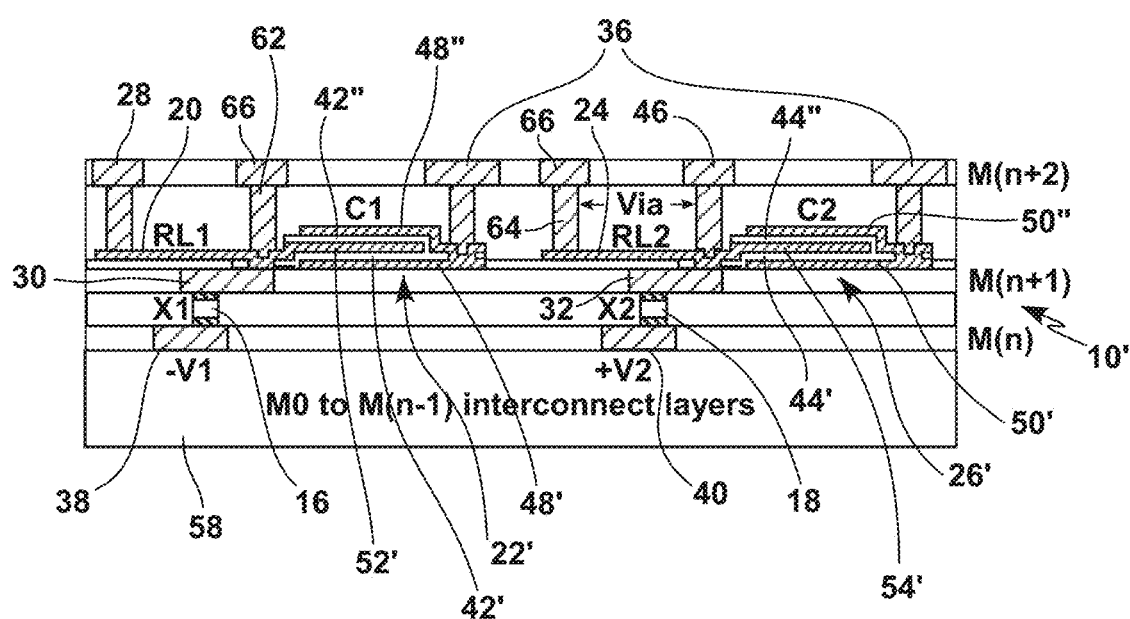
FIG. 3 shows a side cross-section view of an integrated neuron circuit according to an embodiment of this presentation.

FIG. 3 illustrates an integrated neuron circuit 10' according to an embodiment of this presentation, which is essentially identical to the integrated neuron circuit 10 illustrated in FIGS. 2A, 2B, except for the structure of its MIM capacitors (22', 26'). The position of the connection of the second resistor 24 with intermediate node 30 can also be changed with respect to circuit 10. According to an embodiment, intermediate node 30 can be connected to an end of resistor 24 by third metal conductors 62, 64, 66. As illustrated in FIG. 3, such third metal conductors can comprise via connections 62 and 64 joined by a third metal connection line 66 (not fully in the plane of FIG. 3). The via connections 62 and 64 and the connection line 66 can be made at a same time where the third metal layer is formed using a dual-damascene process.

Similar references correspond to similar features in the FIGS. 2A, 2B and 3. According to embodiments of this presentation, at least one of the first (22') and second (26') MIM capacitors of integrated neuron circuit 10' comprises a first electrode (respectively 52', 54') in electrical contact with said conductor (respectively 30, 32) made of said second metal layer of the integrated circuit 10'; said first electrode (52', 54') having top and bottom surfaces in contact with top (respectively 42", 44") and bottom (respectively 42', 44') dielectric layers; said bottom dielectric layer (42', 44') being above and in electrical contact with a bottom second electrode (respectively 48', 50'), itself in electrical contact with a second conductor (36) made of said third metal layer of the integrated circuit; and said top dielectric layer (42", 44") being below and in electrical contact with a top second electrode (48", 50"), itself in electrical contact with said second conductor (36) made of said third metal layer of the integrated circuit 10'. According to an embodiment of this presentation, capacitors 22', 26' can have a larger capacitance than capacitors 22, 26 for a same circuit surface use. For example, assuming the same plate area and dielectric layer thickness, the capacitance density of a 3-plate MIM cap can be twice as large as a 2-plate one.

Advantageously, the capacitance density for MIM capacitors does not scale with the technology feature size as the case of comb capacitors. Using a high-k dielectric, such as HfO2 and ZrO2 (k=25), MIM capacitors used as BEOL decoupling capacitors with a very high capacitance density of 43 fF/μm² has been established in current CMOS technology nodes. Other benefits of MIM capacitors include a high precision and better (lower) capacitance mismatch. The Inventor has also noted that with proper design guidelines, one can actually save chip area by allowing circuits or metal routings under MIM capacitors. Quantitative analysis found that by using MIM capacitors, one can achieve an overall neuron size of 10 μm² with the capacitor values in the order of 1 pF.

Since the switching energies of VO2 NDR devices are negligibly small (typically in the range of 1-100 fJ), the dynamic energy consumption for action potential generation is dominated by the capacitor charging energies ($CV^2/2$), and is hence linearly scaled with the capacitance values. Smaller capacitors are desirable to achieve lower dynamic power consumption. If 0.1 pF capacitors are used, the dynamic spike energy can be less than 0.2 pJ/spike. For reference, a best-reported value in Si-based neurons is 0.4 pJ/spike. If 50 fF capacitors are used, the dynamic spike energy can be less than 0.1 pJ/spike, 0.1 pJ/spike falls within the domain of energy efficiencies for biological neurons. One 50 fF capacitor made with 2-plate MIM technology (with a typical density of 15-20 fF/μm²) can occupy 2 to 3.3 μm² of the chip area, i.e. the total capacitor area in a VO2 neuron can be less than 7 μm². If using the record-high capacitor density of 43 fF/μm², the total capacitor area will be less than 2.3 μm².

Therefore, it is entirely feasible to host an entire VO2 neuron circuit according to this presentation into an area of about 10 um², which can have a dynamic spike energy of <0.1 pJ/spike (in other words, a neuron circuit biologically competitive in sense of both size and energy efficiency).

Spiking operations under such device parameters are confirmed to be feasible.

As outlined above, embodiments of this presentation achieve the integration of a neuron circuit 10, 10' by using thin-film integrated resistors 20, 24. Several common thin film materials, e.g. TaN and SiCr, can be used due to their tunable and relatively large resistivity, and suitable temperature budgets that will not compromise the integrity of the VO2 material. According to an embodiment of this presentation, a same material can be used to manufacture at least one resistor 20, 24 of the integrated neuron circuit 10, 10' and at least one plate of a MIM capacitor 22, 26, 22', 26'. According to an embodiment of this presentation, a same material can be used to manufacture at least one resistor 20, 24 of the integrated neuron circuit 10, 10' and at least one metal contact layer between a portion of a MIM capacitor 22, 26, 22', 26' and an underlying metal layer 30, 32, for example made out of copper.

FIGS. 4A to 4K schematically show each a top view and a side cross-section view of successive steps of a method of manufacturing of an integrated neuron circuit according to an embodiment of this presentation.

FIG. 4A illustrates forming first and second voltage supply leads 38, 40 out of a first metal layer on a top surface 70 of an integrated circuit wafer 58. Voltage supply leads 38, 40 can be made by covering a portion of top surface 70 with a first layer of metal; etching away the metal layer to pattern the voltage supply leads 38, 40; then dielectric backfilling by covering the wafer with a dielectric layer and planarizing the dielectric layer (for example using Chemical Mechanical Planarization) until a top surface of leads 38, 40 is exposed. A new top surface 74 of the wafer is thus formed.

FIG. 4B illustrates forming first 16 and second 18 negative differential resistance circuits/devices having regions of negative differential resistance material on portions of said first 38 and second 40 voltage supply leads. This can be accomplished by covering the top surface 74 of the wafer with a layer of Vanadium Dioxide or VO2, then dry-etching away the VO2 from the portions of the surface 74 such that VO2 regions remain only on portions of voltage supply leads 38 and 40. According to embodiments of this presentation, a thin layer of contact metal 56; for example Si3N4, can be formed below the VO2 layer (and etched away as the VO2 layer); in particular if voltage supply leads 38 and 40 are made out of a Cu metal layer. A thin layer of contact metal 56 can similarly be formed on top of the VO2 layer (and etched away as the VO2 layer).

FIG. 4C illustrates forming a second dielectric layer 76 on portions of the top surface 74 of the wafer not covered by the negative differential resistance material regions of the first and second negative differential resistance material devices 16, 18; for example by covering the wafer with a dielectric layer 76 and planarizing the dielectric layer (for example using Chemical Mechanical Planarization) until a top surface of the negative differential resistance material regions of the first and second negative differential resistance devices 16, 18 (or of contact metal layer 56 above said regions if any) is exposed. A new top surface 78 of the wafer is thus formed.

FIG. 4D illustrates forming first 30 and second 32 connection lines (the first and second intermediate nodes) out of a second metal layer on and in electrical contact with the negative differential resistance material regions of the first and second negative differential resistance devices 16, 18 (or contact metal layer 56 above said regions if any), and on said second dielectric layer 76; and forming a third dielectric layer 80 on portions of the top surface 78 of the wafer not covered by said first and second connection lines 30, 32. The third dielectric layer 80 can be formed in the same way as the second and first dielectric layers 76, 72. A new top surface 82 of the wafer is thus formed. According to an embodiment of this presentation, via-holes 81 can be etched at this juncture through dielectric layers 80 and 76 to voltage supply leads 38 and 40, as shown in the top view graph (they are out of plane and therefore not visible in the side view graph). As shown in the top view, first and second connection lines 30, 32 can be broadened in areas that are to contact the MIM capacitors of the neuron circuit. The third dielectric can be a low-k dielectric.

FIG. 4E illustrates forming a dielectric thin film 84 on the top surface 82 of the wafer; and patterning (etch-opening) said dielectric thin film 84 to form areas of contact of first and second connection lines 30, 32. The Dielectric thin-film can be a low-k dielectric.

FIG. 4F illustrates forming a first lower capacitor plate 52 and a first resistor line 20 out of a first metal thin-film 86, on previously exposed contact portions of the first connection line 30 and on portions of the thin film dielectric layer 84, and forming a second lower capacitor plate 54 and a second resistor line 24 out of said first metal thin-film on portions of the second connection line 32 and on portions of the thin-film dielectric layer 84, the second resistor line 24 contacting the first 30 and second 32 connection lines. The above can for example be achieved by deposition and etch patterning of a metallic film 86 that can be a film of materials (TaN, SiCr, . . . ) generally provided for making thin film resistors. According to embodiments of this presentation, the same metallic film 86 is used to form lower capacitor plates (52, 54) to prevent contamination; for example Cu contamination if first and second connection lines 30, 32 are made out of Cu.

FIG. 4G illustrates covering the first 52 and second 54 lower capacitor plates with a capacitor dielectric layer (respectively 42, 44), for example by deposition and etch patterning of a high-k dielectric layer (HfO2, ZrO2, . . . ) having a thickness appropriate for the MIM capacitors.

FIG. 4H illustrates covering portions of the capacitor dielectric layer (42, 44) with first 48 and second 50 upper capacitor plates formed out of a second metal thin-film layer. This operation can be achieved by deposition and etch patterning of a further metallic film of the same materials (TaN, SiCr, . . . ) as used for film 86.

Figure 4I:
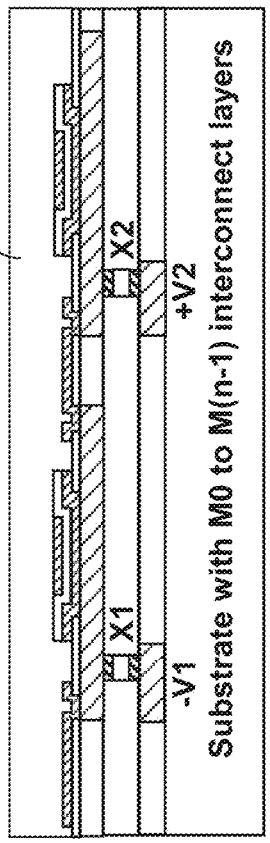

FIG. 4I illustrates forming a fourth dielectric layer 88 on the top surface of the wafer. Dielectric layer 88 can be a low-k dielectric and can be planarized, for example by chemical-mechanical planarization (CMP).

Figure 4J:
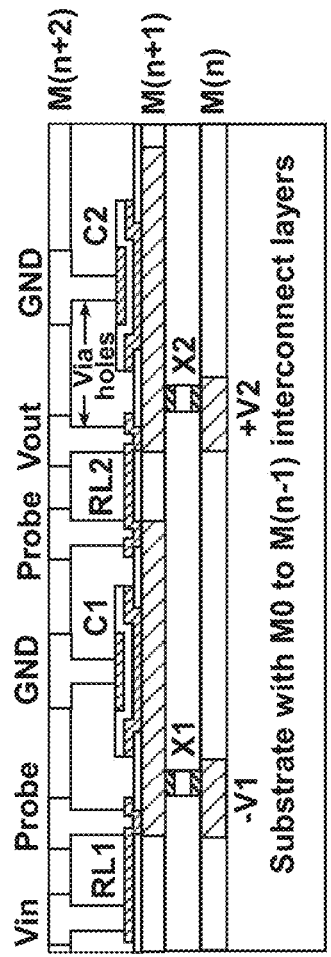
Figure 4K:
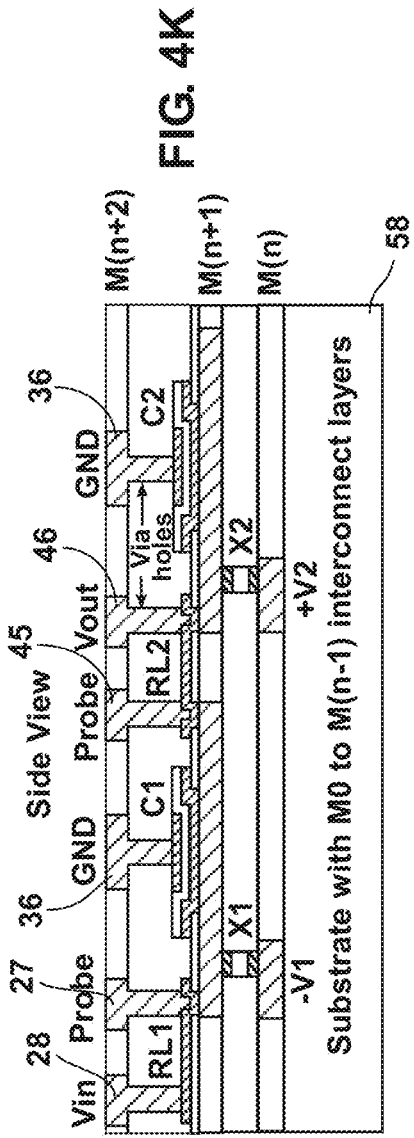
Figures 5A, 5B, 5C:
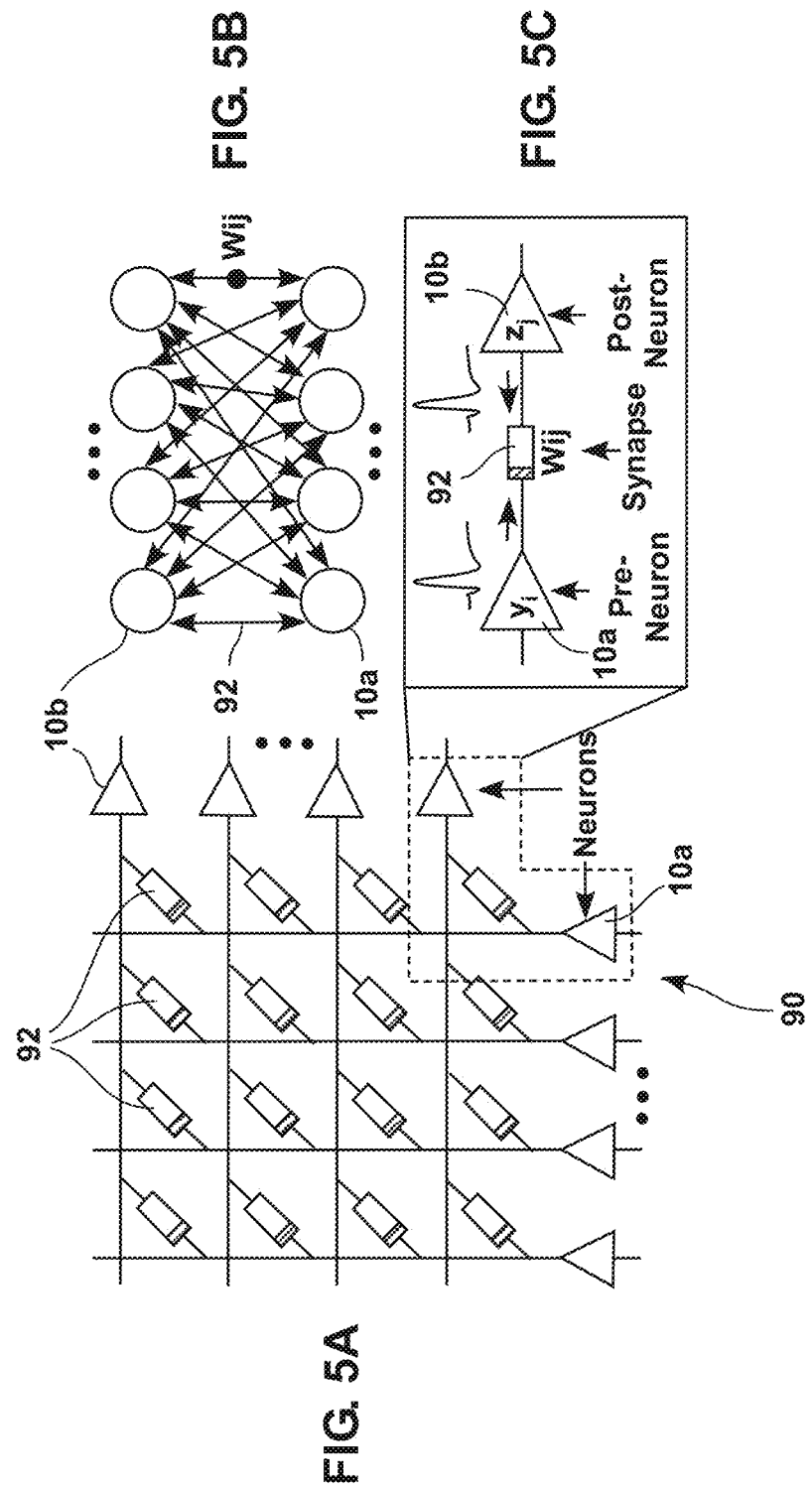
FIG. 5A schematically shows a portion of an integrated neural network using integrated neuron circuits according to embodiments of this presentation.
FIG. 5B schematically shows a diagram equivalent to the portion of neural network illustrated in FIG. 5A.
FIG. 5C schematically shows a detail of the portion of neural network illustrated in FIG. 5A.

FIG. 4J illustrates forming through the fourth dielectric layer 88 via holes for connection: to the first 48 and second 50 upper capacitor plates (ground node 36 connection); to a portion of the second resistor line 24 above the second connection line 32 (output node 46 connection) and to a portion of the first resistor line (20) not above the first connection line 30 (input node 28 connection). According to an embodiment of this presentation, the via holes can be etched at the bottom of recesses provided to form metal connections between the via holes, according to a dual damascene process. The via holes and their dual damascene metal connection recesses can then be filled with a third metal layer, as illustrated in FIG. 4K. The top surface of the wafer can then be planarized, for example with CMP FIG. 5A schematically shows a portion of an integrated neural network such as a neurosynaptic core 90 that uses integrated neuron circuits 10a, 10b according to embodiments of this presentation, for example identical to the integrated neuron circuits 10 or 10' described hereabove. According to an embodiment of this presentation, neurosynaptic core 90 comprises of a crossbar array of passive-memristor devices 92. Passive memristors are nonvolatile resistively-switching circuit elements used in resistive random access memory (RRAM) technology. Each of the passive memristor/RRAM cross-junction device 92 forming a plastic synapse between a pair of integrated VO2 neurons 10 (triangular symbols) Here, "plastic" synapse means that the weight (usually represented by device conductance) of the synapse can be continuously adjusted by voltage or current stimuli, and the synapse has nonvolatile memory to maintain the conductance value even after the stimulus is turned off. It is noted that passive-memristor/RRAM devices 92 as used according to embodiments of this presentation are provided for multi-level continuously switching synapse applications, and may differ from commercially available RRAM devices that are optimized for binary digital data storage. Each synapse is connected to only one row and one column of the array of synapses. Some neurons 10 act as pre-synaptic neurons 10*a*. Each pre-synaptic neuron 10*a* has its output 46 connected to all the synapses 92 of an associated column of the array of synapses 92. Other neurons 10 act as post-synaptic neurons 10*b*. Each post-synaptic neuron 10*b* has its input 28 connected to all the synapses 92 of an associated row of the array of synapses 92.

FIG. 5B illustrates a corresponding neural network graph with nodes (circles) representing neurons 10*a*, 10*b* and edges (arrows) that represent synapses 92. Double-side arrows indicate that information flows (in the form of spike trains) are bidirectional. It is to be noted that bidirectional arrows are used in FIG. 5B to include all possible scenarios, but an actual neural net architecture could use unidirectional synapses. It is for example noted that some neural network architectures, such as deep-learning convolutional neural networks (CNN), use back propagation for errors during training, but run in feedforward only mode when doing image recognition. Some neural network architectures also comprise lateral (e.g. inhibitory) connections between neurons in a same layer (lateral connections not shown in FIG. 5B).

FIG. 5C illustrates a memristor synapse 92 (synaptic weight: wij) connecting memristor 92's pre-neuron 10*a* (yi) and post-neuron 10*b* (zj). Each of pre-neuron 10*a* (yi) and post-neuron 10*b* (zj) can have the structure shown in FIG. 1 and can be made as shown in FIGS. 2-4. The synaptic weight is represented by the resistance of the memristor synapse 92, that can be continuously programmed through the relative timing of the spike sent from the pre-neuron 10*a* and the spike sent from the post-neuron 10*b*, for example along a spike-timing-dependent plasticity (STDP) scheme.

Figure 6A:
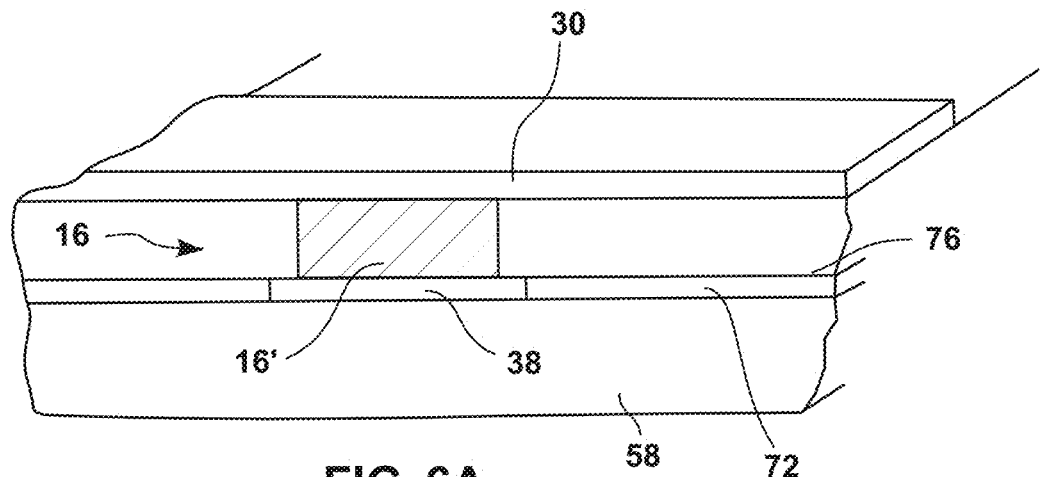
FIGS. 6A and 6B schematically show a cross section of metal-oxide-metal negative differential resistance devices of an integrated neuron circuit according to embodiments of this presentation.

FIG. 6*a* schematically shows a cross section of a metal-oxide-metal negative differential resistance device or circuit (16, 18 in the previous figures) of an integrated neuron circuit (10, 10') according to embodiments of this presentation. Device 16 is illustrated but device 18 can be identical. According to embodiments of this presentation, negative differential resistance device 16 can comprise a region 16' of VO2 formed above voltage supply lead 38, for example by selectively etching a layer of VO2 formed (for example by sputtering) above the supply lead 38 and the dielectric layer 72.

Figure 6B:
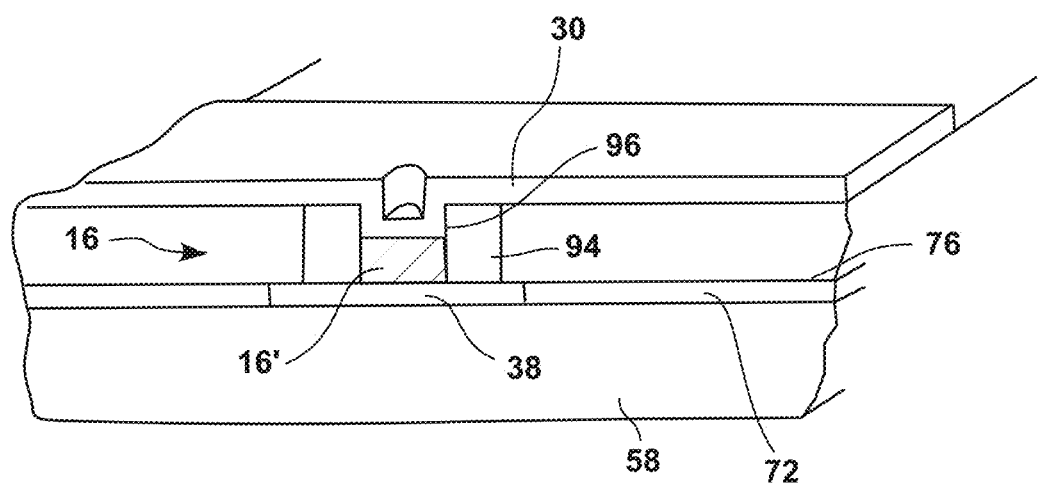

FIG. 6*b* schematically shows a cross section of a metal-oxide-metal negative differential resistance device or circuit (16, 18 in the previous figures) of an integrated neuron circuit (10, 10') according to embodiments of this presentation. Device 16 is illustrated but device 18 can be identical. According to embodiments of this presentation, negative differential resistance device 16 can be manufactured as detailed in U.S. application Ser. No. 15/417,049, and can comprise a region 16' of VO2 formed in a vanadium pentoxide layer region 94, itself formed above voltage supply lead 38. Region 16' can be created by electroforming in a region of heightened conductivity of the vanadium pentoxide layer 94, for example a region of lesser thickness obtained by etching a recess 96 on top of vanadium pentoxide layer 94 before forming the metal layer of intermediate node 30. The electroforming process can be such as detailed in U.S. application Ser. No. 15/417,049, incorporated herein by reference.

Figure 7:
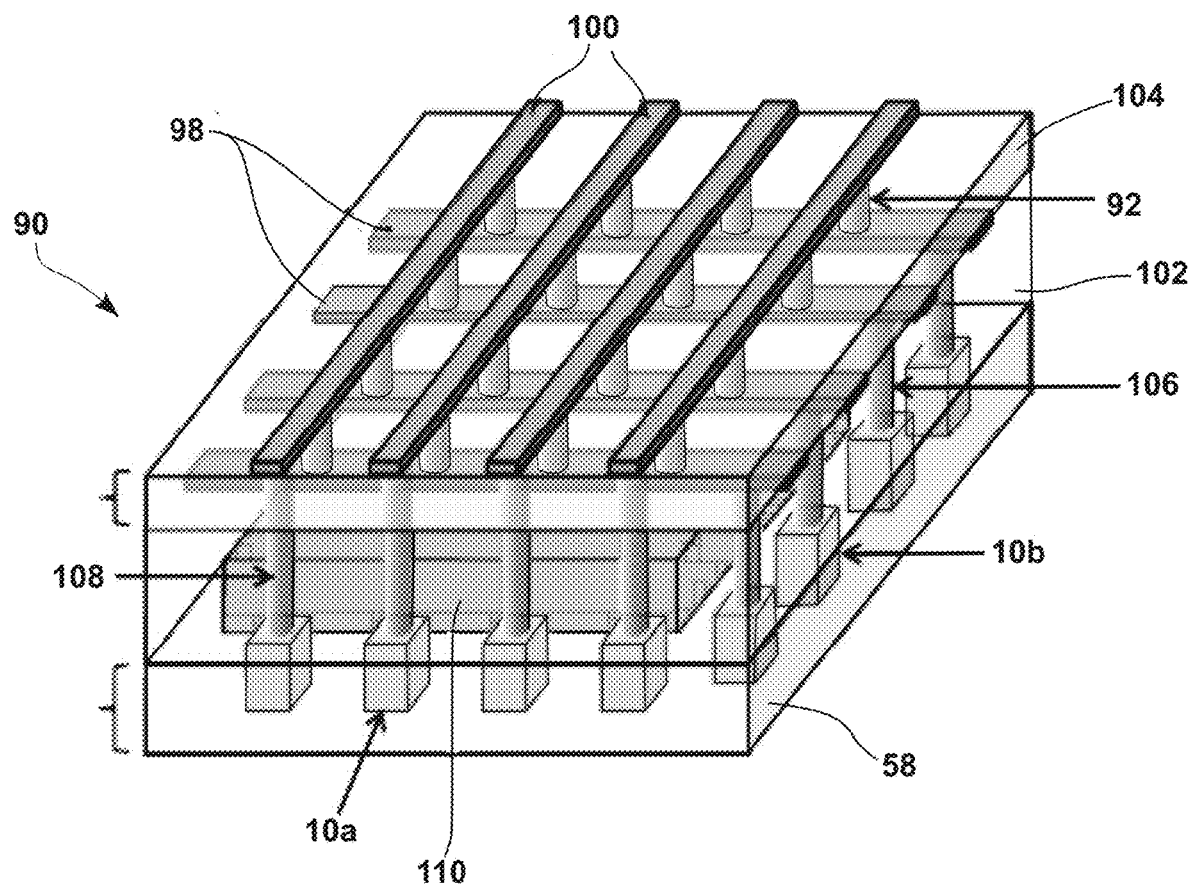
FIG. 7 schematically shows an elevation view of a portion of an integrated neural network such as illustrated in FIG. 5A.

FIG. 7 schematically shows an elevation view of a portion of an integrated neural network 90 such as illustrated in FIG. 5A. According to an embodiment of this presentation, the pre-synaptic neurons 10*a* and the post-synaptic neurons 10*b* can all be formed on a same wafer 58. According to an embodiment of this presentation, the array of memristor synapses 92 can be formed on further set of layers of material on wafer 58. In FIG. 7, the array of memristor synapses 92 comprises one metal conductor 98 parallel to each row of memristor synapses 92 and one metal conductor 100 parallel to each column of memristor synapses 92, each memristor synapse 92 being formed vertically between one conductor 98 and one conductor 100 at each intersection of the rows and columns of the array. According to an embodiment of this presentation, metal conductors 98 can be formed on top of a dielectric layer 102, itself formed on top of the last layer (including third metal layer and top dielectric layer on wafer 58 as shown in FIG. 4K). A dielectric layer 104 can be formed on top of the dielectric layer 102 and conductors 98. Memristor synapses 92 can be formed in recesses of layer 104 reaching conductors 98, before conductors 100 are formed on top of layer 104 and in contact with memristor synapses 92. Via connections 106 passing through layer 102 can connect the input 28 of each post-synaptic neurons 10*b* to a corresponding row conductor 98; and via connections 108 passing through layers 102 and 104 can connect the output 46 of each pre-synaptic neurons 10*a* to a corresponding column conductor 100.

The non-illustrated inputs of the pre-neurons 10*a* and outputs of the post-neurons 10*b* can be connected to other synapses or to electronic input or output circuitry, for example CMOS circuits 110 fabricated on a portion of wafer 58 that is not used by the neuron circuits 10. According to embodiments of this presentation, the inputs of the pre-neurons and outputs of the post-neurons can be connected to input sensors such as image sensor pixels or output interface to a memory or to a display circuit (not shown).

Figure 8:
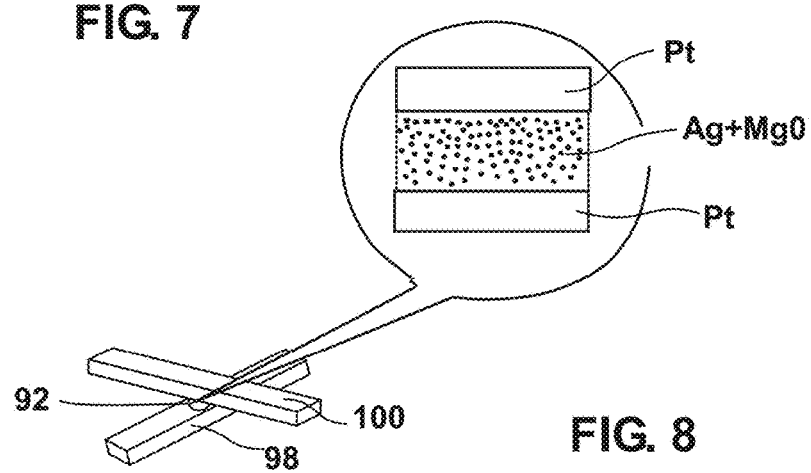
FIG. 8 illustrates schematically a cross-section of a synaptic connection such as shown in FIG. 7.

FIG. 8 illustrates a memristor synapse 92. According to an embodiment of this presentation, memristor synapses 92 can be made as described in the document "Nanoscale Memristor Device as Synapse in Neuromorphic Systems" by Sung Hyun Jo, Ting Chang, Idongesit Ebong, Bhavitavya B. Bhadviya, Pinaki Mazumder and Wei Lu; DOI: 10.1021/nl904092h/Nano Lett. 2010, 10, 1297-13-1) and can comprise a co-sputtered Ag and Si active layer with an Ag/Si mixture ratio gradient that leads to the formation of an Ag-rich (high conductivity) layer and an Ag-poor (low conductivity) layer between the conductors 98 and 100.

Memristor synapses 92 can also be made as described in the document "MEMRISTORS WITH DIFFUSIVE DYNAMICS AS SYNAPTIC EMULATORS FOR NEUROMORPHIC COMPUTING" (by Zhongrui Wang et al.); NATURE MATERIALS; DOI: 10.1038/NMAT4756, by growing on p-type (100) Si wafer with 100 nm thermal oxide as follows: bottom electrodes can be patterned by photolithography followed by evaporation and liftoff of a 20-nm-thick Pt(Au) layer. A 15-nm-thick doped dielectric can then be deposited at room temperature by reactively co-sputtering MgO (illustrated in FIG. 8) or HfO2 and Ag in an ambient of mixed Ar and O2, or co-sputtering Si and Ag in Ar, N2 and O2. Top 30 nm Pt(Au) electrodes can then be patterned by photolithography, followed by evaporation and liftoff processes. Electrical contact pads of the bottom electrodes can be patterned by photolithography and then subjected to reactive ion etching with mixed CHF3 and O2 gases.

In other words, at each cross junction of conductors 98 and 100, a synapse 92 can be formed by a nonvolatile passive memristor/RRAM device, connecting the pre-synaptic neuron 10*a* on the same column and the post-synaptic neuron on the same row. According to an embodiment of this presentation, the (Neuron+Synapse) stack pair can be repeated multiple times to mimic the six-layer cerebral cortex of mammalian brains, as illustrated in FIG. 9.

Figure 9:
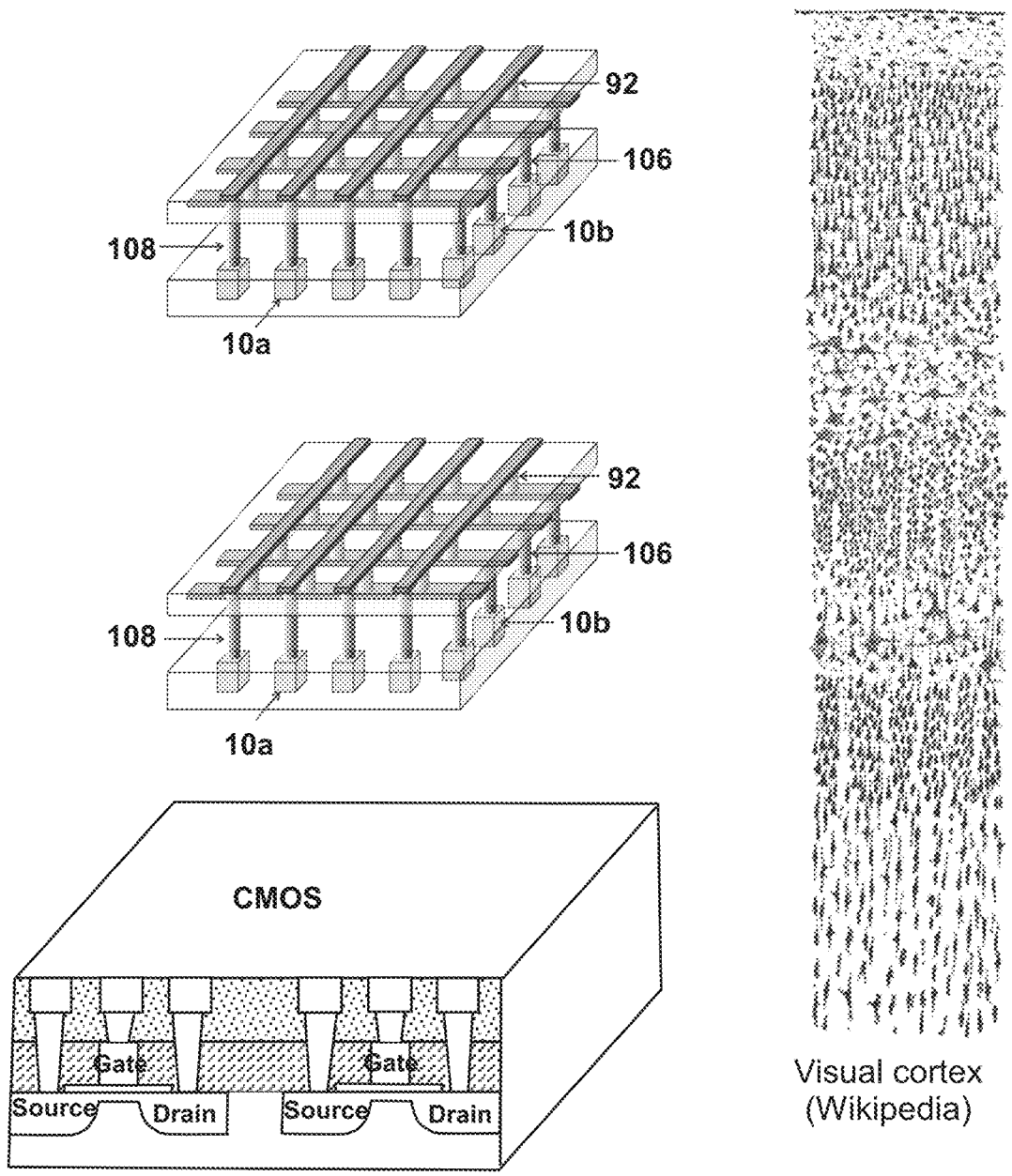
FIG. 9 illustrates schematically a combination of neural networks according to embodiments of this presentation.

FIG. 9 schematically illustrates a "2.5-dimensional neurosynaptic network" comprising a plurality of vertically stacked multiple Neuron/Synapse layers on top of a conventional silicon CMOS substrate (which can for example comprise visual, audio, or other types of sensory input and signal pre-processing circuits connected to inputs of the first pre-synaptic neurons). The CMOS substrate does not undertake the main perceptive and/or cognitive computational loads, but plays beneficial supporting roles, such as voltage or power regulation, signal conditioning/filtering, inter-core and inter-chip communications, A/D and D/A conversions, I/O interface, etc. Such a network achieves (1) ultrahigh neuron and synapse density; and (2) enhanced neuron-to-neuron connectivity which is no longer restricted to the limitation of only one active device (silicon MOSFET) layer in conventional CMOS-based neuromorphic ICs. It forms roughly one-to-one mapping to human cortical layer (a vertical cross-section of human visual cortex is shown on the right of FIG. 9 for illustration). The illustration in FIG. 9 is not intended to be exhaustive nor to limit the invention to the precise form(s) described. For those skilled in the art, schemes other than the proposed Al- or Cu-BEOL processes can be used to implement the 2.5-dimensional neurosynaptic network. Examples include, but are not limited to, hetero-integration utilizing chip-to-wafer or wafer-to-wafer bonding technologies and through-wafer via connections; and board-level integration schemes using macroscopic printed circuit board (PCB) process (suitable for applications wherein the synaptic density and array scale are not concerned).

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this presentation is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of manufacturing an integrated neuron circuit structure, the method comprising:
    forming first and second voltage supply leads out of a first metal layer on a top surface of an integrated circuit wafer;
    forming a first dielectric layer on portions of the top surface of the wafer not covered by said first metal layer;
    forming first and second negative differential resistance material regions on portions of said first and second voltage supply leads;
    forming a second dielectric layer on portions of the top surface of the wafer not covered by said first and second negative differential resistance material regions;
    forming first and second intermediate node lines out of a second metal layer on said first and second negative differential resistance material regions and on said second dielectric layer;
    forming a third dielectric layer on portions of the top surface of the wafer not covered by said first and second intermediate node lines;
    forming a dielectric thin film on the top surface of the wafer;
    patterning said dielectric thin film and forming a first lower capacitor plate and a first resistor line out of a first metal thin-film on portions of the first intermediate node line and on portions of the thin film dielectric layer, and forming a second lower capacitor plate and a second resistor line out of said first metal thin-film on portions of the second intermediate node line and on portions of the thin-film dielectric layer, the second resistor line contacting the first and second intermediate node lines;
    covering the first and second lower capacitor plates with a capacitor dielectric layer;
    covering portions of the capacitor dielectric layer with first and second upper capacitor plates formed out of a second metal thin-film layer;
    forming a fourth dielectric layer on the top surface of the wafer;
    forming through the fourth dielectric layer via connections to the first and second upper capacitor plates; to a portion of the second resistor line above the second connection line and to a portion of the first resistor line not above the first connection line; the via connections being made out a third metal layer.

2. The method of claim 1, further comprising forming via connections to the first and second voltage supply leads.

3. The method of claim 1, wherein said forming via connections comprises using a dual damascene process to form further connections of the vias.

4. The method of claim 1, wherein said integrated circuit wafer comprises CMOS circuits and said first, second and third metal layers are three consecutive metal layers of the CMOS fabrication process.

5. The method of claim 1, further comprising forming contact metal layer films between the negative differential resistance material regions and the first and second metal layers.

6. The method of claim 1, wherein the first, third and fourth dielectric layers comprise a high-k dielectric material, and the second dielectric layer and dielectric thin film comprise a low-k dielectric material.

7. The method of claim 1, wherein said metal layers are copper, tungsten or aluminum layers.

8. The method of claim 1, wherein said thin-film layers are TaN or SiCr layers.

9. The method of claim 1, wherein said dielectric layer is a HfO2 or ZrO2 layer.

10. The method of claim 1, wherein said region of Negative Differential Resistance material is a region of VO2.

11. The method of claim 1, wherein said contact metal layers are TiN or TaN layers.

* * * * *